(12) United States Patent
Gross et al.

(10) Patent No.: US 12,144,088 B2
(45) Date of Patent: Nov. 12, 2024

(54) INDUCTION COOKTOP

(71) Applicant: Miele & Cie. KG, Guetersloh (DE)

(72) Inventors: Simon Gross, Buende (DE); Meike Garben, Roedinghausen (DE); Frank Holtmann, Hiddenhausen (DE)

(73) Assignee: MIELE & CIE. KG, Guetersloh (DE)

( * ) Notice: Subject to any disclaimer, the term of this patent is extended or adjusted under 35 U.S.C. 154(b) by 651 days.

(21) Appl. No.: 17/402,728

(22) Filed: Aug. 16, 2021

(65) Prior Publication Data
US 2022/0061133 A1    Feb. 24, 2022

(30) Foreign Application Priority Data
Aug. 18, 2020    (DE) .................. 10 2020 121 633.5

(51) Int. Cl.
*H05B 6/12*    (2006.01)
*F24C 7/08*    (2006.01)
*H05B 6/06*    (2006.01)
*H05K 7/20*    (2006.01)

(52) U.S. Cl.
CPC ........... *H05B 6/1263* (2013.01); *F24C 7/083* (2013.01); *H05K 7/20136* (2013.01)

(58) Field of Classification Search
CPC . F24C 7/083; H05B 2206/022; H05B 6/1209; H05B 6/1263; H05B 6/42; H05K 7/20136
USPC ....... 219/620, 621, 622, 623, 624, 632, 664, 219/672, 391, 439, 490, 481, 452.12; 126/21 A, 19 R, 273 R; 392/371, 376
See application file for complete search history.

(56) References Cited

U.S. PATENT DOCUMENTS 5,428,207 A * 6/1995 Essig ................... H05B 6/1281
219/622
2008/0185376 A1* 8/2008 Gagas .................. H05B 6/1263
219/623

FOREIGN PATENT DOCUMENTS

DE   102012219040 A1   11/2013
KR   20150137756 A     12/2015

* cited by examiner

*Primary Examiner* — Quang T Van
(74) *Attorney, Agent, or Firm* — LEYDIG, VOIT & MAYER, LTD.

(57) ABSTRACT

An induction cooktop includes: a cover plate with at least one cooking point; a retaining plate; at least one inductive heating coil arranged in an intermediate space between the cover plate and the retaining plate; at least one electronics housing fastened to a side of the retaining plate facing away from the at least one heating coil and having electronics for the at least one heating coil; and a lower box closing off the induction cooktop at a bottom of the induction cooktop, the lower box being open at a top of the lower box. The at least one electronics housing with the electronics is arranged in the lower box. The retaining plate covers the lower box at the top of the lower box. The induction cooktop includes a fan for generating a primary cooling air flow for cooling the electronics in the lower box.

12 Claims, 3 Drawing Sheets

INDUCTION COOKTOP

CROSS-REFERENCE TO PRIOR APPLICATION

Priority is claimed to German Patent Application No. DE 10 2020 121 633.5, filed on Aug. 18, 2020, the entire disclosure of which is hereby incorporated by reference herein.

FIELD

The invention relates to an induction cooktop.

BACKGROUND

Such induction cooktops are already known from the prior art in a multitude of different embodiments and comprise a cover plate with at least one cooking point, a support plate, at least one inductive heating coil arranged in an intermediate space between the cover plate and the support plate, at least one electronics housing, which is fastened to a side of the retaining plate remote from the heating coil and has electronics for the heating coil, and a lower box which closes off the induction cooktop at the bottom, the electronics housing with the electronics being arranged in the lower box, which is open at the top, and the retaining plate covering the lower box at the top, and the induction cooktop having a fan by means of which a primary cooling air flow can be generated in the lower box for cooling the electronics.

SUMMARY

In an embodiment, the present invention provides an induction cooktop, comprising: a cover plate with at least one cooking point; a retaining plate; at least one inductive heating coil arranged in an intermediate space between the cover plate and the retaining plate; at least one electronics housing fastened to a side of the retaining plate facing away from the at least one heating coil and having electronics for the at least one heating coil; and a lower box closing off the induction cooktop at a bottom of the induction cooktop, the lower box being open at a top of the lower box, wherein the at least one electronics housing with the electronics is arranged in the lower box, the retaining plate covering the lower box at the top of the lower box, wherein the induction cooktop comprises a fan configured to generate a primary cooling air flow for cooling the electronics in the lower box, and wherein at least one cooling air opening is arranged in the retaining plate, the at least one cooling air opening being flow connected to the lower box such that by the primary cooling air flow flowing in the lower box, a negative pressure is generated at the at least one cooling air opening so as to generate a secondary cooling air flow in the intermediate space for cooling the retaining plate and/or the intermediate space.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
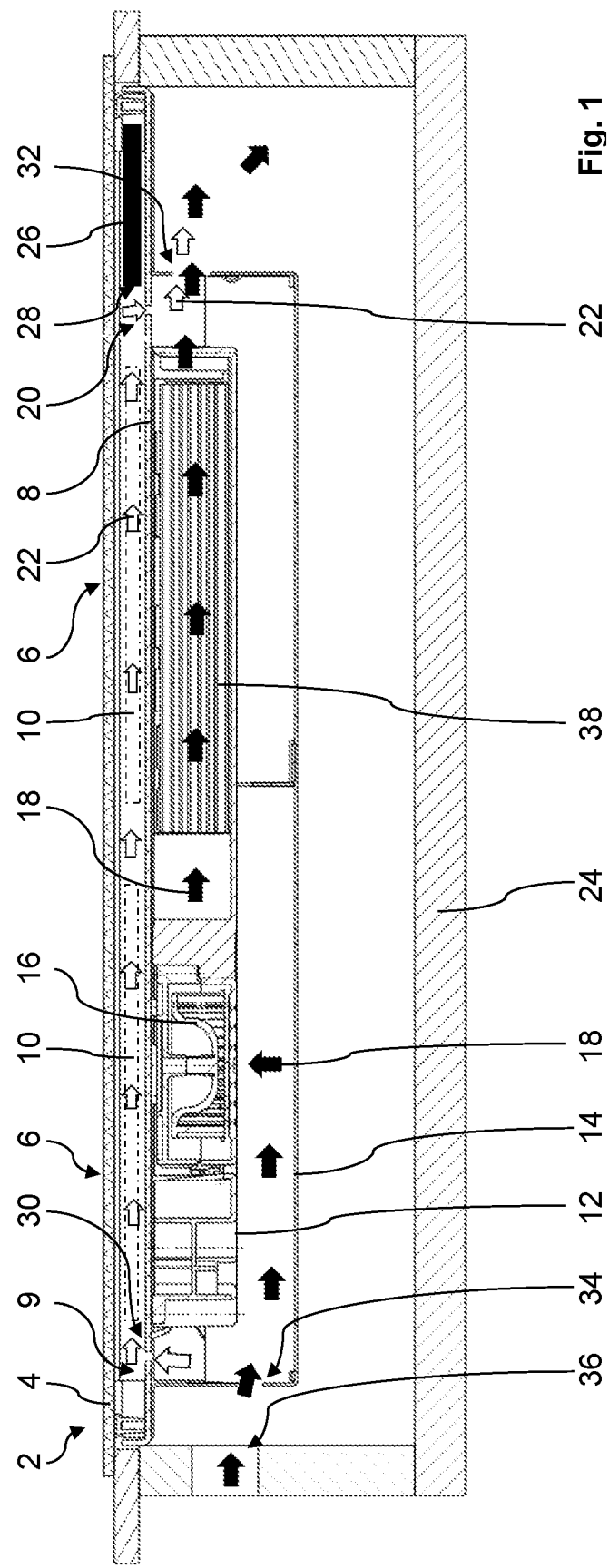
FIG. 1 shows an embodiment of the induction cooktop according to the invention in a lateral sectional view.

In an embodiment, the present invention provides an induction cooktop, which is characterized in that at least one cooling air opening is arranged in the retaining plate, the cooling air opening being fluidically connected to the lower box in such a way that, by means of the primary cooling air flow flowing in the lower box for cooling the electronics, a negative pressure can be generated at the cooling air opening for generating a secondary cooling air flow in the intermediate space for cooling the retaining plate and/or the intermediate space. The primary cooling air flow can be guided only in the lower box or in the lower box and in the electronics housing arranged in the lower box. Advantageous embodiments and developments of the invention will be described in further detail below.

The advantage achievable with the invention is, in particular, that an induction cooktop is improved. Due to the design of the induction cooktop according to the invention, the temperature management during the induction cooktop is substantially improved in a structurally simple manner, for example without a complex and thus cost-intensive isolation or cooling. This applies in particular to induction cooktops, which are provided for the North American market, i.e. for the United States of America (USA) or Canada, since the lower box must necessarily be designed as a so-called plastic collection tray for such induction cooktops. In a possible event of fire, this plastic collection tray is to absorb melted plastic so that it cannot flow out of the induction cooktop. Such a lower box additionally makes the above-mentioned temperature management more difficult in these induction cooktops. The general installation situation of induction cooktops in a closed base cabinet of a kitchen furniture also has an obstruction for temperature management. This is where the invention provides a remedy.

In principle, the induction cooktop according to the invention can be freely selected in terms of type, mode of operation, dimensioning, material and arrangement within wide suitable limits.

A particularly advantageous further development of the induction cooktop according to the invention provides that a cooktop control for operating the induction cooktop is arranged on the retaining plate, wherein the at least one cooling air opening is arranged between the cooktop control on one side and a remainder of the retaining plate, which is connected to the electronics housing in a heat-transferring manner, on the other side. In this way, the cooktop operation, which is particularly critical in terms of temperature management, is very effectively protected from overheating. This is especially important because the cooktop control has a relatively low temperature limit compared to the rest of the induction cooktop.

An advantageous further development of the aforementioned embodiment of the induction cooktop according to the invention provides that the at least one cooling air opening is designed as a plurality of cooling air openings, the plurality of cooling air openings being arranged distributed over the retaining plate in such a way that a side of the cooktop facing the electronics housing is separated by means of the cooling air openings at least on 70% of this side, according to one embodiment at least 80% of this side, preferably essentially completely, from the rest of the retaining plate connected to the electronics housing in a heat-transferring manner. This further improves the thermal decoupling of the cooktop control from the rest of the retaining plate, which is connected to the electronics housing in a heat-transferring manner. In particular, this effectively reduces heat conduction within the retaining plate. This particularly applies to the preferred embodiment of this development.

An advantageous further development of the latter embodiment of the induction cooktop according to the invention provides that the plurality of cooling air openings are arranged parallel to the aforementioned side of the cooktop control in at least two rows, wherein the cooling air openings of the individual rows, parallel to the cooktop control, in particular to the aforementioned side of the cooktop control, are arranged offset from one another and overlapping. In this way, the extensive thermal decoupling of the cooktop control from the rest of the retaining plate, which is connected to the electronics housing in a heat-transferring manner, is optimized and implemented in a particularly simple manner in terms of design.

The cooling air openings of each of the rows has a different distance from the cooktop control, with a distance provided between the rows which is at least 50% of the smallest distance between two cooling air openings within a row. Preferably, the distance between rows is equal to or greater than the smallest distance between two cooling air openings within a row.

The rows do not have to extend linearly. According to the invention, they follow the outer contour of the cooktop control. In this case, the rows can also partially enclose the cooktop control. Preferably, the rows are located on the side or sides of the cooktop control facing an inductive heating coil of the induction cooktop and/or the electronics housing.

The opening cross-section of the cooling air openings is oriented perpendicular to the sides of the cooktop controls or perpendicular to the main flow direction of the cooling air flows through the induction cooktop.

A further advantageous development of the induction cooktop according to the invention provides that at least one fresh air opening is arranged in the retaining plate for supplying fresh air to the intermediate space. The at least one fresh air opening is arranged in the retaining plate. The fresh air openings are dimensioned in such a way that the total flowed-through area of the opening cross sections of all fresh air openings corresponds to at least 50%, preferably more than 70%, of the total flowed-through area of the opening cross sections of all cooling air openings. This achieves a particularly good interstitial flow of the secondary cooling air flow. This ensures that sufficient fresh air can be supplied to the induction cooktop in a defined manner, so that effective cooling of the retaining plate and/or the intermediate space is made possible by means of the secondary cooling air flow. This applies in particular to the preferred embodiment of this development.

Analogous to the at least one cooling air opening, the at least one fresh air opening may be formed as a plurality of fresh air openings, wherein the plurality of fresh air openings are arranged in at least two rows. The individual rows are preferably offset in parallel to one another. According to one embodiment, the fresh air openings of the individual rows are offset from each other in a projection perpendicular to the course of the rows and are arranged to overlap.

Preferably, the rows are aligned parallel to an edge of the induction cooktop that is the greatest distance from the cooktop control and/or the user when the cooktop is in the installed position. According to one embodiment, the distances for the fresh air openings are analogous to the distances described for the cooling air openings.

An advantageous further development of the aforementioned embodiment of the induction cooktop according to the invention provides that the at least one fresh air opening is arranged on a side of the retaining plate opposite to the at least one cooling air opening. In this way, the secondary cooling air flow can be applied over a large area of the retaining plate in a simple manner in terms of design and flow technology.

Another advantageous further development of the induction cooktop according to the invention provides that the at least one cooling air opening is arranged in the region of at least one outlet opening in the lower box and/or in the electronics housing for the exit of the primary cooling air flow from the lower box and/or the electronics housing. This allows the secondary cooling air flow to flow over a large part of the retaining plate on the cooling air opening side, so that large-area cooling of the retaining plate and/or the intermediate space by means of the secondary cooling air flow is further improved.

Similarly, an advantageous further development of the induction cooktop provides that the at least one fresh air opening is arranged in the region of at least one inlet opening in the lower box and/or in the electronics housing for the entry of the primary cooling air flow into the lower box and/or the electronics housing. In this way, as an alternative or in addition to the aforementioned further development, the secondary cooling air flow can flow over a large part of the retaining plate on the fresh air opening side, so that large-area cooling of the retaining plate and/or the intermediate space by means of the secondary cooling air flow is also additionally improved.

To accommodate temperature-induced stresses, it is provided that the smallest distance between two cooling air openings or between two fresh air openings within a row is greater than half the opening width of the adjacent cooling air openings or fresh air openings in the row transverse to the longitudinal extent of the row.

A further particularly advantageous further development of the induction cooktop according to the invention provides that the at least one cooling air opening and/or the at least one fresh air opening are/is simultaneously formed as an expansion opening, wherein the expansion opening is formed in such a way that the retaining plate remains substantially dimensionally stable in any operating state of the induction hob.

The function of the expansion opening is achieved by providing a small distance between the cooling air openings or fresh air openings in one row and a significantly larger distance between the cooling air openings or fresh air openings in the other row. Preferably, the larger distances are at least five times the smaller distances. The function of the expansion opening is further achieved by overlapping the small spacing of one row of cooling air openings or fresh air openings in the other row. This overlap is relative to a projection perpendicular to the longitudinal extension of the rows. The cooling air openings or fresh air openings in the other row have a longitudinal extension which is greater than the extension of the small distances. According to one embodiment, the cooling air openings or fresh air openings in the other row have a longitudinal extent that measures three to nine of the extent of the small distances.

The overlapping cooling air openings or fresh air openings in the other row are preferably symmetrical to the small distances.

If the thermal expansion of the material is concentrated in the area of the smallest distances between two cooling air openings or between two fresh air openings, the expansion opening in the other row, which is also referred to as an expansion joint, can absorb the forces. This increases the functionality of the at least one cooling air opening and/or the at least one fresh air opening beyond their cooling function. Additional structural measures or components to ensure the dimensional stability of the retaining plate in any operating state of the induction cooktop are therefore unnecessary, or at least effectively reduced. The aforementioned dimensional stability of the retaining plate is very important for the function of the induction cooktop, since a sufficiently good inductive coupling between the at least one inductive heating coil of the induction cooktop on the one side and an induction cookware placed on one of the at least one cooking point of the induction cooktop on the other side requires a good contact of the inductive heating coil with the cover plate of the induction cooktop.

The distances between adjacent cooling air openings or fresh air openings in a row need not be identical.

In principle, the fan can be freely selected in terms of type, mode of operation, dimensioning, material, arrangement and number within wide suitable limits. An advantageous further development of the induction cooktop according to the invention provides that the fan is arranged in the electronics housing. In this way, a compact design of the induction cooktop according to the invention is made possible.

Figure 2:
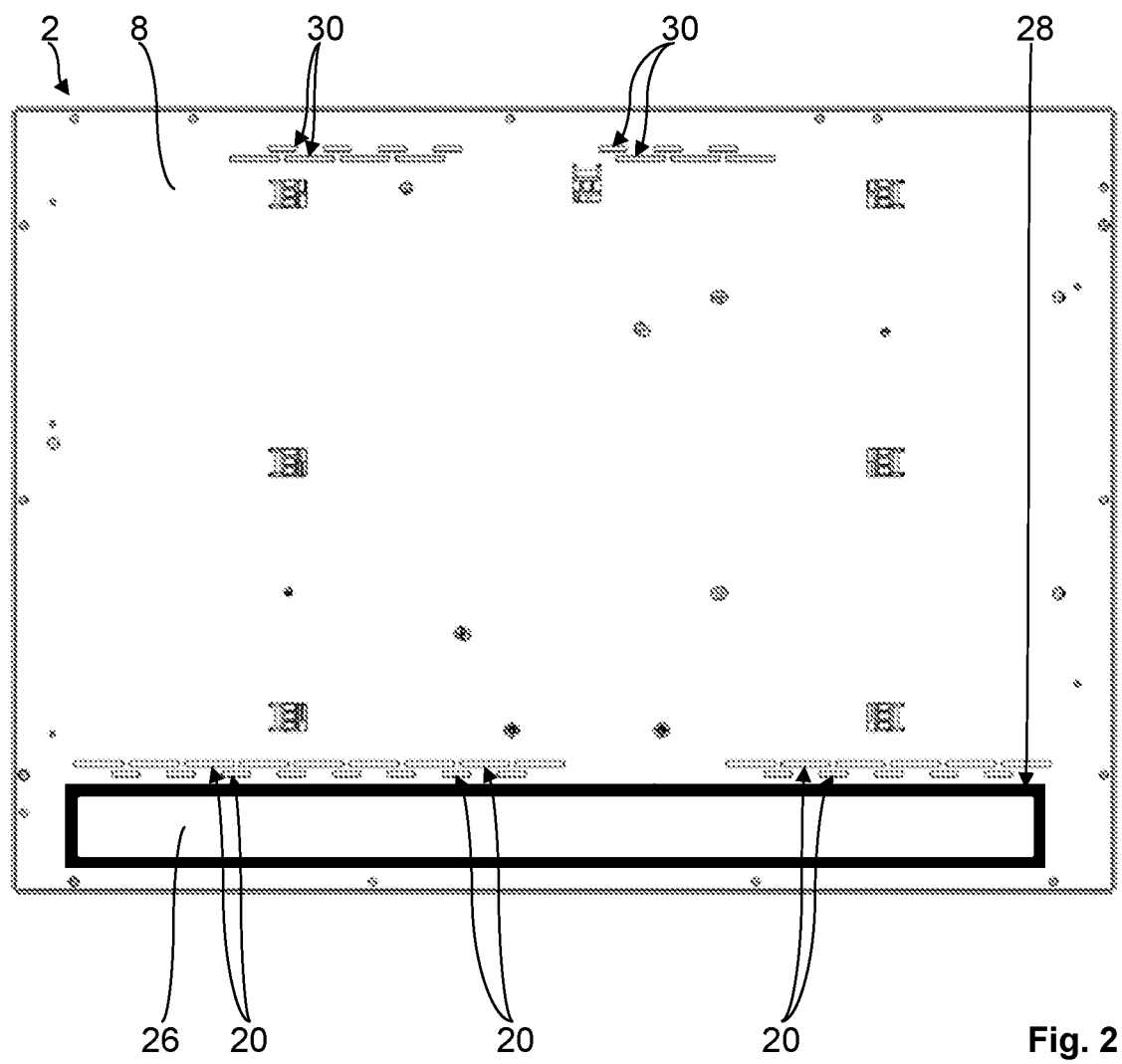
FIG. 2 shows the embodiment in a partial top view of the retaining plate of the induction hob.

FIGS. 1 and 2 show an exemplary embodiment of the induction cooktop according to the invention.

The induction cooktop 2 is designed for domestic use and comprises a cover plate 4 in the form of a glass ceramic plate with a plurality of cooking points 6, a retaining plate 8, a plurality of inductive heating coils 10 arranged in an intermediate space 9 between the cover plate 6 and the retaining plate 8, at least one electronics housing 12 fastened to a side of the retaining plate 8 facing away from the heating coils 10 and having electronics for the heating coils 10, and a lower box 14 closing off the induction cooktop 2 at the bottom, wherein the electronics housing 12 with the electronics is arranged in the upwardly open lower box 14 and the retaining plate 8 covers the lower box 14 at the top, and wherein the induction cooktop 2 has a fan 16 by means of which a primary cooling air flow for cooling the electronics can be generated in the lower box 14. The primary cooling air flow is symbolized by black filled arrows 18 in FIG. 1. The primary cooling air flow can be routed in the lower box only. However, in the present embodiment, the primary cooling airflow 18 is routed in both the lower box 14 and the electronics housing 12 disposed in the lower box 14. As can be seen from FIG. 1, the fan 16 is arranged in the electronics housing 12.

The present induction cooktop 2 is designed to be suitable for the North American market, i.e. for the USA or Canada. Accordingly, the lower box 14 is necessarily designed as a so-called plastic collecting tray. This plastic collection tray is intended to collect melted plastic in the event of a fire, so that it cannot flow out of the induction cooktop 2.

In order to improve temperature management in the induction cooktop 2, a plurality of cooling air openings 20 are arranged in the retaining plate 8, wherein the cooling air openings 20 are fluidically connected to the lower box 14 in such a way that, by means of the primary cooling air flow 18 flowing in the lower box 14 for cooling the electronics, a negative pressure can be generated at the cooling air openings 20 for generating a secondary cooling air flow in the intermediate space 9 for cooling the retaining plate 8 and the intermediate space 9. The secondary cooling air flow is symbolized in FIG. 1 by arrows 22 outlined in black.

The induction cooktop 2 is shown in FIG. 1 in its installation position in a base cabinet 24 of a kitchen unit.

A cooktop control 26 for operating the induction cooktop 2 is further arranged on the retaining plate 8, wherein the cooling air openings 20 are arranged between the cooktop control 26 on one side and a remainder of the retaining plate 8, which is connected to the electronics housing 12 in a heat-transferring manner, on the other side. The plurality of cooling air openings 20 are distributed over the retaining plate 8 in such a way that a side 28 of the cooktop control 26 facing the electronics housing 12 is separated by means of the cooling air openings 20 at least 70%, preferably at least 80%, of this side 28 from the rest of the retaining plate 8, which is connected to the electronics housing 12 in a heat-transferring manner. In this regard, see FIG. 2. In this way, the cooktop 26, which is particularly critical in terms of temperature management, is very effectively protected from overheating. This is particularly important because the cooktop control 26 has a relatively low temperature limit compared to the rest of the induction cooktop 2.

Figure 3:
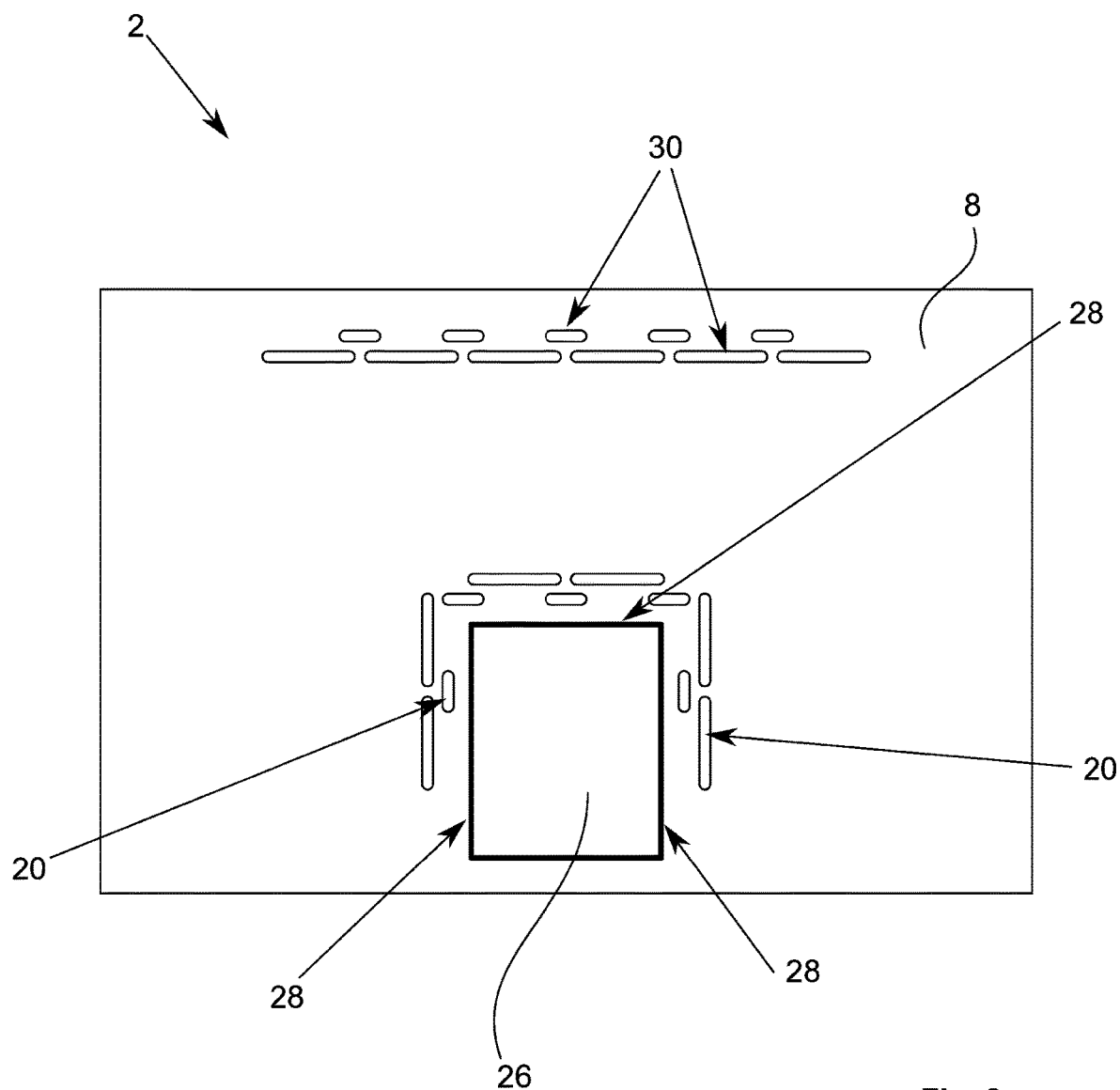
FIG. 3 shows another embodiment of the induction cooktop according to the invention in a partial top view of the induction cooktop support plate.

As can further be clearly seen from FIGS. 2 and 3, the cooling air openings 20 are arranged in sections circumferentially around the cooktop control 26 or following the contour of the cooktop control 26 in two rows, the cooling air openings 20 of the individual rows being arranged parallel to one another and offset and overlapping with respect to one side 28 of the cooktop control 26. In this way, the extensive thermal decoupling of the cooktop control 26 from the rest of the retaining plate 8, which is connected to the electronics housing 12 in a heat-transmitting manner, is optimized and implemented in a structurally particularly simple manner.

In addition to the cooling air openings 20 of the retaining plate 8, a plurality of fresh air openings 30 are arranged in the retaining plate 8 for supplying fresh air into the intermediate space 9, the cross sections of all fresh air openings 30 having a total area which corresponds to at least 50%, preferably more than 70%, of the total area of the cross sections of all cooling air openings 20. See FIGS. 1 and 2 for a synopsis. This ensures that fresh air can be supplied to the induction cooktop 2 sufficiently and in a defined manner, so that effective cooling of the retaining plate 8 and the intermediate space 9 is made possible by means of the secondary cooling air flow 22.

As shown in FIG. 2, the plurality of fresh air openings 30 are arranged on a side of the retaining plate 8 opposite to the plurality of cooling air openings 20. As can further be seen from FIG. 2, the fresh air openings 30 are arranged in two rows, analogous to the cooling air openings 20, with the fresh air openings 30 of the individual rows being arranged parallel to, offset from, and overlapping each other.

In the present embodiment example, in order to allow the secondary cooling air flow 22 to flow over the retaining plate 8 over as large an area as possible, it is provided that the cooling air openings 20 are arranged in the region of at least one outlet opening 32 in the lower box 14 for the exit of the primary cooling air flow 18 from the lower box 14. The same applies to the arrangement of the fresh air openings 30. The fresh air openings 30 are disposed in the region of at least one inlet opening 34 in the lower box 14 for entry of the primary cooling air flow 18 into the lower box 14. In this regard, see FIG. 1. As can be further seen from FIG. 1, the fresh air, i.e. cool ambient air, enters the base cabinet 24, in which the induction cooktop 2 is arranged, from the free environment by means of a supply opening 36 arranged in the base cabinet 24.

In the present embodiment of the induction cooktop 2 according to the invention, in order to effectively prevent, but at least mitigate, undesired deformation, for example undesired bending, of the retaining plate 8 in an operation of the induction cooktop 2, it is provided, that the plurality of cooling air openings 20 and the plurality of fresh air openings 30 are each simultaneously formed as an expansion opening, wherein the expansion openings are formed in such a way that the retaining plate 8 remains substantially dimensionally stable in any operating state of the induction cooktop 2. The aforementioned dimensional stability of the retaining plate 8 is very important for the function of the induction cooktop 2, since a sufficiently good inductive coupling between the inductive heating coils 10 of the induction cooktop 2 on the one hand and an induction cooking utensil placed on one of the cooking points 6 of the induction cooktop 2 on the other hand requires a good contact between the inductive heating coils 10 and the cover plate 4 of the induction cooktop 2. Additional structural measures or components for ensuring the dimensional stability of the retaining plate 8 in any operating state of the induction cooktop 2 are dispensable due to the design of the induction cooktop according to the present embodiment.

In the following, the operation of the induction cooktop according to the present embodiment is explained in more detail with reference to FIGS. 1 and 2.

A user places the above-mentioned induction cookware with a food to be heated on one of the cooking points 6 of the induction cooktop 2 and switches on the inductive heating coil 10 corresponding to this cooking point 6 by means of the cooktop control 26 in a manner known to the skilled person.

Based on the aforementioned start-up of the induction cooktop 2, the fan 16 for cooling the electronics arranged in the electronics housing 12, for example generators for the inductive heating coils 10, is switched on by means of a control system of the induction cooktop 2. In a manner known to those skilled in the art, the fan 16 draws fresh air from the free environment into the lower box 14 by means of the supply opening 36 and the inlet opening 34 and directs this as a primary cooling air flow 18 through the electronics housing 12, which is connected to the lower box 14 in a flow-conducting manner. Here, the primary cooling air flow 18 flows through, among other things, a heat sink 38 having cooling fins, which is connected, among other things, to the retaining plate 8 in a thermally conductive manner. In this regard, see FIG. 1 with the primary cooling air flow 18 drawn therein.

Downstream of the primary cooling airflow 18, the electronics housing 12 is also fluidly connected to the lower box 14 so that the primary cooling airflow 18 again flows from the electronics housing 12 into the lower box 14 and from the lower box 14 into the base cabinet 24. The primary cooling air flow 18 flows past the cooling air openings 20. Due to the so-called Venturi effect, a negative pressure is created at the cooling air openings 20 on the base cabinet side, by means of which the primary cooling air flow 18 draws in air from the intermediate space 9, this air being conveyed together with the primary cooling air flow 18 through the outlet opening 32 into the base cabinet 24.

Due to the negative pressure applied to the cooling air openings 20 on the base cabinet side, a secondary cooling air flow 22 is thus initiated through the intermediate space 9 by means of the primary cooling air flow 18. This secondary cooling air flow 22 flows from the fresh air openings 30 in the intermediate space 9 explained above over a large area over the retaining plate 8 to the cooling air openings 20, so that on the one hand the intermediate space 9 and on the other hand the retaining plate 8 are cooled by means of the secondary cooling air flow 22. In this regard, see FIG. 1 with the secondary cooling air flow 22 drawn therein.

The secondary cooling air flow 22 thus particularly ensures cooling of the retaining plate 8 and thus ensures that, in particular, the temperature limit value for the cooktop control 26 arranged on the retaining plate 8 can be maintained in any operating state of the induction cooktop 2. Furthermore, the cooktop control 26, which is particularly critical in terms of temperature management, is effectively decoupled in terms of heat conduction from the remainder of the retaining plate 8, which is connected to the electronics housing 12 in a heat-transferring manner, by means of the cooling air openings 20.

In addition, the cooling air openings 20 and fresh air openings 30 of the retaining plate 8, which are simultaneously designed as expansion openings, ensure that the retaining plate 8 does not flex in an undesirable manner in any conceivable operating state of the induction cooktop 2. Accordingly, an intimate abutment of the inductive heating coils 10 against the cover plate 4 of the induction cooktop 2 is thus realized in a simple manner in terms of design and manufacturing. This is very important for the proper function of the induction cooktop 2.

On the basis of the induction cooktop according to the present embodiment, the temperature management in the induction cooktop 2 is thus substantially improved in a structurally simple manner, namely without any complex and thus cost-intensive insulation or cooling. This is especially true because the induction cooktop 2 is an induction cooktop for the North American market, i.e. for the USA or Canada. Accordingly, the lower box 14 is necessarily designed as a so-called plastic collecting tray. This plastic collection tray is intended to collect melted plastic in the event of a fire, so that it cannot flow out of the induction cooktop 2.

The invention is not limited to the present exemplary embodiment. For example, the invention can also be advantageously used in induction cooktops for commercial operation, i.e. for professional use. This also applies to induction cooktops in which, unlike the North American market, no special lower box, namely no plastic collection tray, is required.

FIG. 3 shows an embodiment as a modification of the embodiment described in FIGS. 1 and 2. In this induction cooktop, the cooling air openings 20 are arranged in sections circumferentially around the cooktop control 26 or following the contour of the cooktop control 26 on three sides of the cooktop control 26.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a"

or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. An induction cooktop, comprising:
a cover plate with at least one cooking point;
a retaining plate;
at least one inductive heating coil arranged in an intermediate space between the cover plate and the retaining plate;
at least one electronics housing fastened to a side of the retaining plate facing away from the at least one heating coil and having electronics for the at least one heating coil; and
a lower box closing off the induction cooktop at a bottom of the induction cooktop, the lower box being open at a top of the lower box,
wherein the at least one electronics housing with the electronics is arranged in the lower box, the retaining plate covering the lower box at the top of the lower box,
wherein the induction cooktop comprises a fan configured to generate a primary cooling air flow for cooling the electronics in the lower box, and
wherein at least one cooling air opening is arranged in the retaining plate, the at least one cooling air opening being flow connected to the lower box such that by the primary cooling air flow flowing in the lower box, a negative pressure is generated at the at least one cooling air opening so as to generate a secondary cooling air flow in the intermediate space for cooling the retaining plate and/or the intermediate space.

2. The induction cooktop of claim 1, further comprising:
a cooktop control configured to operate the induction cooktop, the cooktop control being arranged on the retaining plate, the at least one cooling air opening being arranged between the cooktop control on one side and a remainder of the retaining plate, which is connected to the at least one electronics housing in a heat-transmitting manner, on an other side.

3. The induction cooktop of claim 2, wherein the at least one cooling air opening comprises a plurality of cooling air openings, the plurality of cooling air openings being distributed over the retaining plate such that a side of the cooktop control facing the at least one electronics housing is separated by the plurality of cooling air openings at least on 70% of a side from the remainder of the retaining plate, which is connected to the at least one electronics housing in a heat-transmitting manner.

4. The induction cooktop of claim 3, wherein the plurality of cooling air openings are arranged in at least two rows, and
wherein the plurality of cooling air openings of the at least two rows, parallel to that of the cooktop control, are arranged offset from each other and overlapping.

5. The induction cooktop of claim 3, wherein plurality of cooling air openings are distributed over the retaining plate such that the side of the cooktop control facing the at least one electronics housing is separated by the plurality of cooling air openings substantially completely from the remainder of the retaining plate.

6. The induction cooktop of claim 1, further comprising:
at least one fresh air opening configured to supply fresh air to the intermediate space, the at least one fresh air opening being arranged in the retaining plate, a total area of all of the at least one fresh air opening corresponding to at least 50% of a total area of all cooling air openings.

7. The induction cooktop of claim 6, wherein the at least one fresh air opening is arranged on a side of the retaining plate opposite the at least one cooling air opening.

8. The induction cooktop of claim 6, wherein the at least one fresh air opening is arranged in a region of at least one inlet opening in the lower box and/or in the at least one electronics housing for entry of the primary cooling air flow into the lower box and/or the at least one electronics housing.

9. The induction cooktop of claim 6, wherein the at least one cooling air opening and/or the at least one fresh air opening comprise/comprises as an expansion opening, the expansion opening being configured such that the retaining plate remains substantially dimensionally stable in any operating state of the induction cooktop.

10. The induction cooktop of claim 6, wherein the total area of all of the at least one fresh air opening corresponding to more than 70% of the total area of all cooling air openings.

11. The induction cooktop of claim 1, wherein the at least one cooling air opening is arranged in a region of at least one outlet opening in the lower box and/or in the at least one electronics housing for exit of the primary cooling air flow from the lower box and/or the at least one electronics housing.

12. The induction cooktop of claim 1, wherein the fan is arranged in the at least one electronics housing.

* * * * *